(12) United States Patent
Mannsfeld et al.

(10) Patent No.: US 9,520,563 B2
(45) Date of Patent: Dec. 13, 2016

(54) PATTERNING OF ORGANIC SEMICONDUCTOR MATERIALS

(75) Inventors: Stefan Christian Bernhardt Mannsfeld, Palo Alto, CA (US); Armon Sharei, San Rafael, CA (US); Zhenan Bao, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 1431 days.

(21) Appl. No.: 12/743,772

(22) PCT Filed: Nov. 20, 2008

(86) PCT No.: PCT/US2008/084139
§ 371 (c)(1),
(2), (4) Date: Jul. 13, 2010

(87) PCT Pub. No.: WO2009/067577
PCT Pub. Date: May 28, 2009

(65) Prior Publication Data
US 2010/0308309 A1    Dec. 9, 2010

Related U.S. Application Data

(60) Provisional application No. 61/003,993, filed on Nov. 21, 2007.

(51) Int. Cl.
*H01L 29/08* (2006.01)
*H01L 51/00* (2006.01)
*H01L 51/05* (2006.01)

(52) U.S. Cl.
CPC ....... *H01L 51/0003* (2013.01); *H01L 51/0012* (2013.01); *H01L 51/0036* (2013.01); *H01L 51/0541* (2013.01)

(58) Field of Classification Search
CPC ............ H01L 51/00; H01L 51/40; G03F 7/20
USPC .............................................. 257/40; 427/57
See application file for complete search history.

(56) References Cited

U.S. PATENT DOCUMENTS

| | | | |
|---|---|---|---|
| 5,143,750 A * | 9/1992 | Yamagata et al. ............ | 427/601 |
| 5,925,893 A * | 7/1999 | Ishii et al. ...................... | 257/40 |
| 6,347,584 B1 * | 2/2002 | Kawamoto et al. .......... | 101/170 |
| 6,403,396 B1 * | 6/2002 | Gudesen et al. ............... | 438/99 |

(Continued)

OTHER PUBLICATIONS

Sergei A. Ponomarenko, "Star-Shaped Oligothiophenes for Solution-Processible Organic Electronics: Flexible Aliphatic Spacers Approa", ReceiVed May 11, 2006. ReVised Manuscript ReceiVed Jun. 23, 2006, Chem. Mater. 2006, 18, 4101-4108.*

*Primary Examiner* — Caleb Henry
(74) *Attorney, Agent, or Firm* — Crawford Maunu PLLC

(57) ABSTRACT

Organic semiconductor material can be patterned from a solution onto a substrate by selectively wetting the substrate with the solution while applying a mechanical disturbance (such as stirring the solution while the substrate is immersed, or wiping the solution on the substrate). The organic semiconductor material can then be precipitated out of the solution, for example to bridge gaps between source and drain electrodes to form transistor devices. In some embodiments, the solution containing the organic semiconductor material can be mixed in an immiscible host liquid. This can allow the use of higher concentration solutions while also using less of the organic semiconductor material.

34 Claims, 3 Drawing Sheets

(56) References Cited

U.S. PATENT DOCUMENTS

| | | | |
|---|---|---|---|
| 6,828,582 B1* | 12/2004 | Ando et al. | 257/40 |
| 6,887,332 B1* | 5/2005 | Kagan et al. | 427/97.3 |
| 6,969,690 B2* | 11/2005 | Zhou et al. | 438/787 |
| 7,078,724 B2* | 7/2006 | Kirchmeyer et al. | 257/40 |
| 7,105,375 B2* | 9/2006 | Wu et al. | 438/99 |
| 7,122,828 B2* | 10/2006 | Bao et al. | 257/40 |
| 7,199,515 B2* | 4/2007 | Seo et al. | 313/504 |
| 7,390,694 B2* | 6/2008 | Yamamoto | 438/99 |
| 7,504,709 B2* | 3/2009 | Masuda et al. | 257/642 |
| 7,704,784 B2* | 4/2010 | Bao et al. | 438/99 |
| 7,722,785 B2* | 5/2010 | Hsu et al. | 252/500 |
| 7,795,145 B2* | 9/2010 | Gomez et al. | 438/687 |
| 2001/0029103 A1* | 10/2001 | Katz et al. | 438/689 |
| 2005/0045885 A1 | 3/2005 | Kim et al. | |
| 2005/0133087 A1 | 6/2005 | Alivisatos et al. | |
| 2006/0160265 A1* | 7/2006 | Morii et al. | 438/87 |
| 2006/0273303 A1* | 12/2006 | Wu et al. | 257/40 |
| 2006/0289858 A1* | 12/2006 | Park et al. | 257/40 |
| 2007/0066080 A1* | 3/2007 | Kugler et al. | 438/725 |
| 2007/0109457 A1* | 5/2007 | Song et al. | 349/44 |
| 2007/0249087 A1* | 10/2007 | Zhu et al. | 438/99 |
| 2007/0282094 A1* | 12/2007 | Marks et al. | 528/377 |
| 2008/0232031 A1* | 9/2008 | Ning | 361/509 |
| 2010/0163414 A1* | 7/2010 | Gillies et al. | 204/547 |

* cited by examiner

PATTERNING OF ORGANIC SEMICONDUCTOR MATERIALS

RELATED PATENT DOCUMENTS

This patent document is the national stage filing under 35 U.S.C. §371 of International Application No. PCT/US2008/084139 filed on Nov. 20, 2008, which claims the benefit, under 35 U.S.C. §119(e), of U.S. Provisional Patent Application Ser. No. 61/003,993 filed on Nov. 21, 2007 and entitled "Patterning of Organic Semiconductor Materials;" each of these patent documents is fully incorporated herein by reference.

FEDERALLY-SPONSORED RESEARCH OR DEVELOPMENT

This invention was made with Government support under contracts FA9550-06-1-0126 awarded by the Air Force Office of Scientific Research and by contract 0213618 awarded by the National Science Foundation. The Government has certain rights in this invention.

FIELD OF THE INVENTION

The present invention relates generally to patterning organic semiconductor materials, and more particularly to arrangements and approaches for patterning organic semiconductor material to make devices.

BACKGROUND

Semiconductor device applications have experienced significant scaling (reduction in size) over recent years, with continued scaling desirable for a multitude of applications. In addition, semiconductors and semiconductor devices are increasingly used in cross-disciplinary applications, in various configurations, and in unique operating environments.

Many semiconductor applications involve and/or would benefit from the use and implementation of organic semiconductor materials. Organic single-crystal field-effect transistors are useful for the study of charge transport in organic semiconductor materials. In addition, their high performance and outstanding electrical characteristics make them desirable for implementation with electronic applications such as active matrix displays or sensor arrays. For example, organic field-effect transistors are often implemented with organic thin-film transistors (OTFT, or OTFTs). OTFTs are useful for performing a variety of functions and offer unique characteristics desirable for many applications. See, e.g., Sze, S. M. *Semiconductor Devices: Physics and Technology*, 2nd edition; Wiley: New York, 1981. Generally, many OTFTs are low in weight, flexible in application and/or inexpensively manufactured; as such, OTFTs have been used in a multitude of applications. Other organic semiconductor structures include organic light-emitting diodes, organic lasers, organic solar cells and organic biosensors.

While organic single crystal semiconductors can provide superior performance and outstanding electrical characteristics, particularly in low-cost microelectronics applications (such as active matrix displays or sensor arrays), difficulties in device fabrication have limited their use. Patterning of organic semiconductors is of particular importance, for example to eliminate parasitic current paths (i.e., crosstalk) between neighboring devices. For low cost deposition over a large area, solution-based single crystal deposition and patterning techniques are highly desirable.

Previous approaches to the manufacture of organic materials have been generally limited to the formation of layers or films of organic materials. Approaches to sizing or arranging organic materials have been generally tedious, time-consuming and expensive. In addition, such layers or films are not readily implemented for use with certain applications benefiting from certain shape, orientation or arrangement of organic single crystal materials. In particular, organic single crystal materials are not readily implemented for manufacture on a relatively large scale.

As devices are scaled smaller, cross-talk issues can become more challenging. One approach to reducing or minimizing cross-talk between neighboring devices involves separation of semiconductor materials, such as by patterning an active semiconductor layer. However, with single-crystal organic semiconductor materials, there is often a need to hand-select individual crystals, which presents challenges to producing single crystal devices at high density and with reasonable throughput. In particular, while arrays of inorganic crystals have been patterned over large areas, patterning discrete organic molecular crystals has been particularly challenging.

These and other issues have been challenging to the design, manufacture and implementation of semiconductor devices, and in particular, for those semiconductor devices employing organic semiconductor materials.

OVERVIEW

The present invention is directed to overcoming the above-mentioned challenges and others related to the types of applications discussed above and in other applications. These and other aspects of the present invention are exemplified in a number of illustrated implementations and applications, some of which are shown in the figures and characterized in the claims section that follows.

According to example embodiments, the present invention provides methods for manufacturing organic semiconductor devices on a substrate having an array of electrode pairs. The methods include selectively wetting the electrode pairs with a solution of organic semiconductor material while a mechanical disturbance is applied. The organic semiconductor material is then precipitated from the solution to bridge gaps between the electrodes in the electrode pairs.

According to example embodiments, the present invention further provides methods for manufacturing organic semiconductor devices on a substrate having an array of electrode pairs, including steps of selectively wetting the electrode pairs with a solution of organic semiconductor material using a mixture of the solution residing in an immiscible host liquid 330, and precipitating the organic semiconductor material from the solution to bridge gaps between the electrodes in the electrode pairs.

According to example embodiments, the present invention further provides methods of patterning a material on selected areas on a substrate surface, where the methods include forming a solution of the material in a solvent, forming an immiscible mixture of the solution in a host liquid, and exposing the substrate surface to the mixture so that the solution selectively wets the selected areas. Optionally, the solvent has a higher density than the host liquid. After selectively wetting the selected areas with the solution, the material can be precipitated out of the solution.

The above overview is not intended to describe each illustrated embodiment or every implementation of the present invention.

BRIEF DESCRIPTION OF THE DRAWINGS

The invention may be more completely understood in consideration of the detailed description of various embodiments of the invention that follows in connection with the accompanying drawings, in which.

Figure 1:
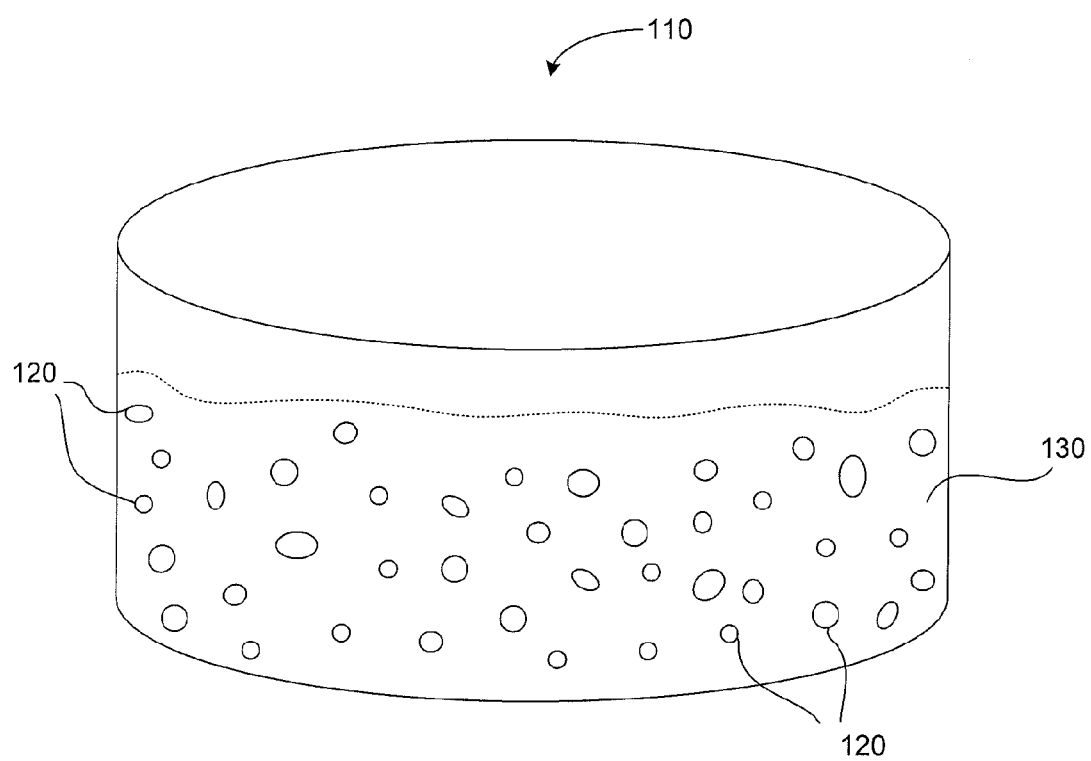
FIG. 1 shows a mixture for patterning material from a solution in accordance with certain embodiments of the present invention.

While the invention is amenable to various modifications and alternative forms, examples thereof have been shown by way of example in the drawings and will be described in detail. It should be understood, however, that the intention is not to limit the invention to the particular embodiments shown and/or described. On the contrary, the intention is to cover all modifications, equivalents, and alternatives falling within the spirit and scope of the invention.

DETAILED DESCRIPTION

The present invention is believed to be applicable to a variety of different types of processes, devices and arrangements for patterning materials on selected areas of a substrate, for example patterning organic semiconductor materials to bridge electrodes in the formation of organic field effect transistors (FETs or OFETs). While the present invention is not necessarily so limited, various aspects of the invention may be appreciated through a discussion of examples using this context.

According to example embodiments of the present invention, an approach to semiconductor device manufacture involves the fabrication and implementation of arrays of patterned organic crystals formed by precipitating the organic material out of a solution that has been patterned onto an array of electrodes by selectively wetting the electrodes with the solution. In some embodiments, the solution is applied to the substrate while also applying a mechanical disturbance, for example agitating the solution while immersing the substrate, or directly wiping the solution on the substrate. In some embodiments, the solution is delivered using a mixture that contains the solution in an immiscible host liquid. Such embodiments can allow the use of a higher concentration solution while using less organic semiconductor material.

In accordance with certain embodiments of the present invention, a molecular solution is cast directly onto transistor device substrates and the solution self-aligns to selected areas. Transistor substrates can include, for example, arrays of source-drain gold electrodes on rigid or flexible substrates. For some applications, the substrate can have a chemically-modified dielectric surface to promote preferential adsorption of the molecular solution on the electrode areas.

In certain other embodiments, the transistor substrate is submerged into a rapidly stirred liquid vortex containing the organic semiconductor solution (for example in the form of small droplets dispersed within an immiscible host liquid). The droplets of molecular solution selectively wet the electrode areas. During subsequent solvent evaporation, organic crystals nucleate from these droplets forming arrays of organic field effect transistors.

Embodiments of the present invention address problems that exist with other patterning approaches, including speed of the patterning process (generally slow for dip-coating and other common solution-based methods), the amount of molecular material required (relatively large amount of material required for dip-coating and other common solution-based methods), and ability to register the material with a pre-patterned substrate (commonly presenting alignment problems). Exemplary embodiments of the present disclosure provide a high throughput way to pattern a relatively small amount of solution (for example, about 20 to 100 µL to pattern several 1 in$^2$ sized transistor substrates) by self-alignment of droplets of molecular solutions on the electrodes. The droplets of organic semiconductor solution that are directly patterned onto the electrode structures are formed into organic crystal in the desired locations by precipitating the organic material out of the solution (e.g., by evaporation of the solvent).

Embodiments of the present invention can also be used to address difficulties presented in common molecular solution based techniques relating to the solution concentration. While it may be desirable to use molecular solutions that are close to their saturation level, such solutions can be too viscous to obtain clean patterning at resolutions useful for semiconductor devices (e.g., a few hundred micrometers or less) from methods such as drop-casting, solvent-evaporation, or dip-coating. In exemplary embodiments of the present invention, droplets of the molecular solution are dispersed in an immiscible host liquid that has desirable handling properties, and the mixture is applied to the device substrate. In this way, saturated or near-saturated solutions can be used without using excessive amounts of organic material, and while maintaining process integrity and device resolution.

FIG. 1 illustrates a mixture 110 for use in certain embodiments of the present invention to pattern an organic semiconductor material. The mixture 110 includes droplets of an organic semiconductor solution 120 dispersed in an immiscible liquid 130. Solution 120 includes an organic semiconductor material dissolved in a solvent. Exemplary organic semiconductor solutions include oligothiophenes with solubilizing side chain substituents dissolved in a halogenated aromatic solvent such as bromobenzene, 1,2-dichlorobenzene (DCB), or 1,2,4-trichlorobenzene (TCB). Immiscible liquid 130 can be any suitable liquid in which the solution can reside in a phase separated state. In exemplary embodiments, the density of the solvent is higher than the density of the host liquid, for example to promote dispersion of the solution in the host liquid.

In some applications, the immiscible liquid used as a carrier medium for the solution allows the selection and use of highly concentrated solutions independent of concern for the viscosity of the solution. This allows selection of the immiscible host liquid's viscosity that is desirable for certain processing conditions.

The use of an immiscible host liquid can dramatically lower the required amount of molecular material (for example, by a factor of approximately 10,000). This approach is particularly desirable in cases when novel or expensive materials are only available in small quantities.

To make an exemplary mixture, a small amount (typically 20 to 100 µL) of nearly saturated molecular solution can be added into a beaker containing an immiscible host liquid (typically 100-200 ml). In some example applications, water is used as the host liquid for patterning of molecular solutions in halogenated solvents. The mixture can be stirred or otherwise agitated to achieve a desired average size of the solution droplets, as discussed in more detail below.

Figure 2:
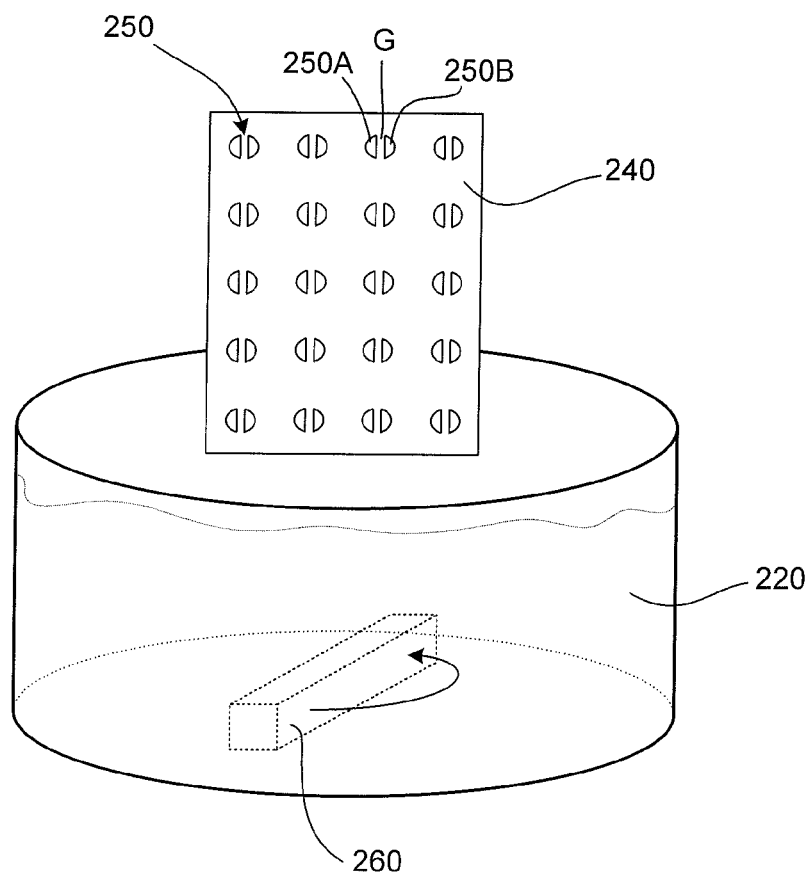
FIG. 2 shows a configuration for patterning material from a solution in accordance with certain embodiments of the present invention.

FIG. 2 illustrates a manner of patterning an organic semiconductor solution 220 onto a patterned substrate 240. For example, the substrate 240 can be exposed to the solution 220 by immersion. Solution 220 can be provided in an immiscible host liquid such as shown in FIG. 1, or can be provided as a neat solution (i.e., not mixed with another liquid). Substrate 240 includes an array of electrode pairs 250, each including a first electrode 250A and a second electrode 250B separate by a gap G. Electrodes 250A and 250B can serve as source and drain electrodes when manufacturing an array of OFETs. The electrodes 250 are selected, and optionally treated, to be relatively lyophilic to the solution 220. The remainder of the surface of substrate 240 is called the background, which in certain embodiments is treated by chemical or physical modification to be relatively lyophobic to the solution 220. For example, $Si/SiO_2$ substrates can be provided with arrays of gold electrode pads, with the surface of the substrate being chemically modified with octadecyltrimethoxysilane (OTS), thereby generating a lyophobic substrate background around the gold electrodes.

In accordance with certain embodiments, the solution is applied to the patterned substrate under mechanical disturbance. In the case of FIG. 2, a stirring bar 260 can be used to agitate the liquid, for example to the point of generating a vortex. The substrate is immersed into the agitated liquid. In embodiments where the liquid includes the molecular solution 220 dispersed in an immiscible host, the agitation can serve to break down and disperse droplets of the molecular solution. In an example, the transistor substrate is dipped into the vessel containing the liquid for a period of about 5 seconds and then slowly pulled out over a period of about 1 to 2 seconds. In certain embodiments, the dipping and removing processes are performed over a time period that is much shorter than what would be possible with a patterning technique based on common approaches such as dip-coating, drop-casting or solvent-evaporation methods. After removal of the substrate, droplets of the molecular solution selectively adhere to the gold electrode pads.

The liquid vortex can be used to significantly improve the selectivity of the molecular solution droplet formation on the electrodes. Agitation of the liquid is used to mitigate or prevent the spurious formation of droplet formation on the lyophobic surface regions of the substrate. Without being bound by any theory, the effect of shearing forces exerted on the substrate surface by the vortex can be used to strip off small droplets that adsorb on the lyophobic surface regions, while also trimming larger droplets of the solution that might otherwise cover multiple adjacent electrode pairs down to the size of a single electrode pair.

While trimming the droplets to match the electrode geometry can be desirable for achieving clean patterns, it can also impose an upper limit on the size of the gap between the source-drain electrodes. When the gap between electrodes is too wide, individual droplets may form on each electrode of the pair, making it unlikely that a working transistor having an organic crystal or film bridging the gap will form. Consequently, the gap is set sufficiently small so that a droplet that initially wets the electrode pair does not prematurely fragment.

While sets of electrodes are described in terms of electrode pairs, and while FIG. 2 indicates a circular shape for the electrode regions, a variety of electrode configuration can be used. For example, electrode configurations can be used that include a series of parallel rectangular bars of different lengths (e.g., from short to long and back to short across the width of the electrode region), where the channels between the bars are sufficiently small to allow bridging by the organic semiconductor solution.

Figure 3A:
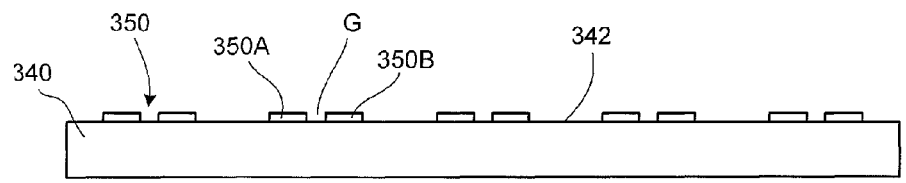
FIGS. 3A-D show steps involved in patterning material from a solution in accordance with certain embodiments of the present invention.

FIGS. 3A-D illustrate the results of various steps produced in connection with embodiments of the present invention. FIG. 3A illustrates a device substrate 340 that includes an array of electrode pairs 350 disposed on a surface 342. Electrode pairs include, for example, a first electrode 350A and a second electrode 350B separated by a gap G. Surface 342 is preferably lyophobic to the molecular solution that is to be patterned on the electrodes.

Figure 3B:
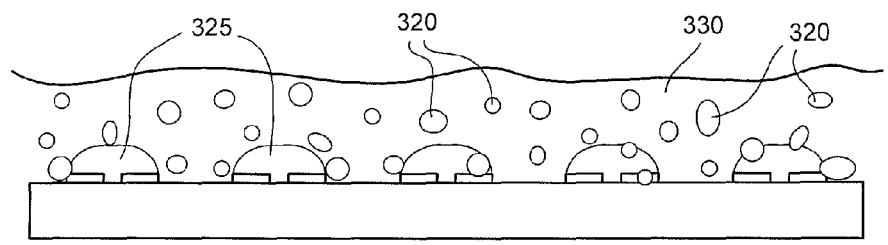

FIG. 3B illustrates a liquid in contact with the substrate surface. As shown, the liquid includes droplets of an organic semiconductor solution 320 dispersed in an immiscible host liquid, such as the mixture shown in FIG. 1. Alternatively, the liquid can include the molecular solution without being disposed in the host liquid. Contact between the liquid and the substrate surface can be made in any suitable manner, for example by immersion as shown in FIG. 2. In certain embodiments, some mechanical disturbance is applied as the liquid is in contact with the substrate, for example to facilitate removal of the solution from the substrate surface background areas 342. As indicated in FIG. 3B, the solution 320 selectively wets the electrode areas, for example forming single droplets 325 that bridge the electrodes of an electrode pair without creating bridges between separate electrode pairs.

Figure 3C:
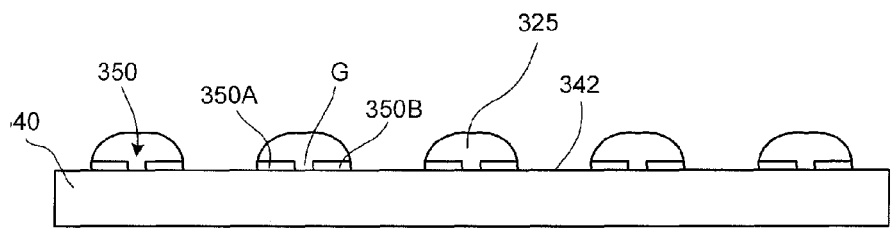

FIG. 3C illustrates the substrate 340 after removal from contact with the liquid. As shown, a single droplet 325 of the solution resides on each of the electrode pairs 350, and each droplet 325 bridges the gap G between electrodes 350A and 350B in an electrode pair. The background surface 342 is substantially free of solution adsorption. Such self-alignment mitigates accumulation of solution on the background surface, thereby reducing the risk for undesired crosstalk between adjacent devices. In embodiments of the present invention, registration between the organic crystals and the electrodes is thus achieved automatically and without the need for tedious alignment steps.

Figure 3D:
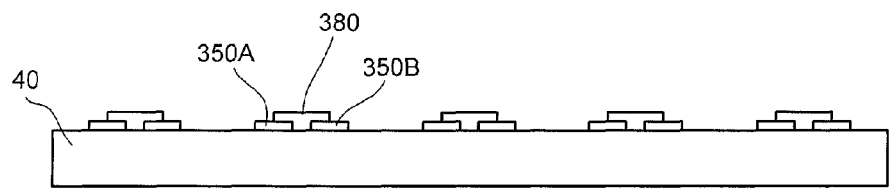

After the selective patterning of the solution as shown in FIG. 3C, the organic semiconductor material can be precipitated out of the solution to form crystals that bridge the electrode gaps, thereby forming completed devices (upon making proper electrical connections to the electrodes) as indicated in FIG. 3D. After precipitation, an example device substrate 340 includes a plurality of devices, each having a first electrode 350A, a second electrode 350B, and a bridging organic semiconductor 380. Precipitation of the organic semiconductor material is preferably performed under conditions that promote single crystal growth of the organic semiconductor material as the solvent is evaporated.

The quality and size of the crystals depend on the specific molecular material, but also the choice of appropriate patterning and post-patterning (evaporation stage) conditions. For example, promoting crystal growth conditions from a single seed that nucleates in the droplet soon after removal of the substrate from the liquid can lead to the formation of a single (or very few) large crystals.

The final crystal size can also be controlled based on the total amount of material dissolved in the droplets (i.e., the concentration of the molecular solution that is patterned). To increase the concentration while keeping the viscosity sufficiently low for clean patterning, the applied liquid (whether the immiscible mixture containing the solution or the solution itself) can be heated to increase the solubility of the molecular material and lower the viscosity of the molecular solution. For example, in certain embodiments, the molecular solution can be heated prior to injecting it into an immiscible host liquid. As another example, the liquid used for patterning can be held at an elevated temperature of about 70-80° C. Patterning can also be performed in ice baths at temperatures around 0° C. (e.g., for low boiling point solvents such as chloroform).

The rate of solvent evaporation from the patterned droplets can also be controlled to produce desired quantity and quality of crystal formation. For example, high boiling point solvents, such as DCB or TCB, can promote slower evaporation, leading to fewer, higher quality crystals. Controlling the vapor pressure above the substrate can also be used to control the rate of evaporation of solvents, particularly in applications where the patterned droplets of solution exhibit a high surface-to-volume ratio. For example, by transferring the solution-patterned substrates into a small, closed environment (such as a small petri dish) immediately after patterning, the resulting increase in vapor pressure can reduce the speed of solvent evaporation.

It should be noted that the patterning techniques disclosed herein are not limited to patterning of organic semiconductor crystals, or even to patterning organic crystals. Methods of the present invention can be generally employed, for example using any two liquids that are immiscible, where the denser liquid is used as the solvent of the material to be patterned. Methods of the present invention can be implemented using simple and inexpensive components, and are expected to be fully scalable to larger geometries without obvious technical limitations.

Transistor characteristics were measured for numerous CH-4T and TMS-4T single crystal transistors made using methods in accordance with experimental embodiments of the present invention. The field effect mobility was calculated from transfer curves in the saturation regime using standard equations. A capacitance of 10 $nF/cm^2$ was calculated for the transistors patterned on Si wafers with a 300 nm thick $SiO_2$ layer. Transistors fabricated with CH-4T or TMS-4T exhibit typical p-channel characteristics. The average mobility obtained from measurements of 31 separate TMS-4T devices was $(0.038\pm0.005)$ $cm^2(Vs)^{-1}$ (errors are reported in this document as standard error of the mean) but in some devices mobility values as high as 0.11 $cm^2(Vs)^{-1}$ were obtained.

In connection with the present invention, it has been found that devices that exhibited lower mobilities typically showed higher $I_{on}/I_{off}$ ratios. The average mobility obtained from measurements of 10 separate CH-4T devices was $(0.01\pm0.004)$ $cm^2(Vs)^{-1}$ with a maximum mobility of $cm^2(Vs)^{-1}$. Thinner crystals were often observed to result in better performing devices, presumably due to their better conformal contact with the dielectric surface in the channel region. In addition to single crystals of small molecule organic semiconductors, we also successfully patterned the soluble semiconducting polymer poly(2,5-bis(3-alkylthiophen-2-yl)thieno[3,2-b]thiophene) (PBTTT). The average mobility measured in 13 separate transistors before annealing of the sample was $(0.023\pm0.003)$ $cm^2(Vs)^{-1}$ with a maximum mobility of 0.04 $cm^2(Vs)^{-1}$; the highest $I_{on}/I_{off}$ ratio was about $6.4\times10^4$. The performance improved significantly after annealing at 180° C. for 10 min followed by slow cooling back to room temperature (over 30 min). The average hole mobility obtained from measurements of 10 devices after the annealing procedure was $(0.13\pm0.02)$ $cm^2(Vs)^{-1}$ with a maximum mobility of 0.16 $cm^2(Vs)^{-1}$. The $I_{on}/I_{off}$ ratio in these devices was slightly lower, on the order of $10^3$.

Consistent with the above-described embodiment(s), simple, rapid, versatile and easy to scale-up techniques suitable to pattern large arrays of working FET devices from solution-phase have been developed. These techniques may be particularly useful for depositing crystals of small organic semiconductors. Their high tendency to crystallize makes it difficult to form uniform films. These techniques allow fine control over the crystallization conditions and results in single crystal formation in the channel region.

Also consistent with the present invention, experimental embodiments demonstrate usefulness in various semiconductor applications. In one such embodiment, bottom contact electrode arrays were fabricated by thermal evaporation of a Cr adhesion layer (1.5 nm) and Au (30 nm) onto photo-lithographically defined resist patterns on highly n-doped $SiO_2$ wafers with a 300 nm thermal oxide, followed by liftoff in acetone. The wafer is then cut into 1-inch-by-1-inch-sized pieces that contained arrays of gold electrode pads. The $SiO_2$ regions were then modified by octadecyltrimethoxysilane (OTS) according to following procedure. The wafer pieces were cleaned in a UV-ozone cleaner for 20 mins, followed by rinsing with de-ionized water immediately before spin-coating of the OTS solution (3 mM in trichloroethylene) at 3000 rpm for 30 secs. Subsequently, the wafer pieces were transferred into a desiccator together with a small vial containing a few droplets of hydrochloric acid (to facilitate cross-linkage in the OTS layer and to the substrate) and stored under vacuum for 12 hours. In order to remove any OTS that physisorbed on the gold electrodes, the samples were sonicated in toluene for 30 mins and then gently swabbed with a swab stick soaked with toluene. Before use in patterning experiments, the contact angle was checked to be greater than 90°.

To prepare the solution for deposition, 10-100 µl of solution were added to the patterning beaker containing 100 ml de-ionized water. The molecular solution was close to the saturation point. Desirable observed results were obtained for the following concentrations: 5 mg/ml CHAT in TCB, 7-8 mg/ml TMS-4T in TCB, 100 mg/ml PBTIT in TCB).

The solution concentration changes slowly over time as constant operation of the patterning beaker results in significant evaporation of the solvent. This is compensated by addition of small amounts of the neat solvent as necessary. The temperature of the host liquid is usually kept at room temperature. In case of PBTTT patterning, substantially better results were obtained at 80° C. The stirring bar power was maintained at the highest setting that did not lead to a turbulent flow in the beaker. The molecular solution was heated immediately before injection into the patterning beaker using a heat gun (to temperatures approaching 100-150° C.). After injection of the solution, the transistor substrate was completely immersed into the dispersion for about 5 secs. Then the sample was slowly (within 1-2 secs) removed from near the beaker wall where the flow was the most uniform. In order to reduce the speed of solvent droplet evaporation, the substrate was immediately transferred into a (closed) small petri dish. Before transistor measurements, the substrate was dried in a vacuum oven at about 70° C. for at least 2 hours in order to remove trapped solvent. The electrical characterization of the resulting transistor devices is performed under ambient conditions using a Keithley 4200SCS semiconductor parameter analyzer.

In addition, various example embodiments involve the combination of one or more of the above examples with one or more embodiments described above, and/or in connection with the underlying priority document. Similarly, other example embodiments involve the combination of one or more examples from the priority document with embodiments described herein and/or shown in the figures.

While the present invention has been described above and in the claims that follow, those skilled in the art will recognize that changes may be made thereto without departing from the spirit and scope of the present invention. Such changes may include, for example, the implementation of one or more approaches as described in the priority document, including approaches described in the references listed therein. These and other approaches as described in the contemplated claims below characterize aspects of the present invention.

What is claimed is:

1. A method for manufacturing organic semiconductor devices on a substrate having an array of electrode pairs, the method comprising:
   selectively wetting the electrode pairs with a solution of organic semiconductor material while a mechanical disturbance is applied to the solution; and
   precipitating the organic semiconductor material from the solution to bridge gaps between the electrodes in the electrode pairs, wherein the mechanical disturbance comprises stirring the solution while the substrate is immersed in a mixture containing the solution in an immiscible host liquid.

2. The method of claim 1, wherein the mechanical disturbance comprises wiping the solution onto the substrate.

3. The method of claim 1, further comprising modifying a surface of the substrate to promote selective wetting of the electrode pairs by the solution.

4. A method for manufacturing organic semiconductor devices on a substrate having an array of electrode pairs, the method comprising:
   selectively wetting the electrode pairs with a solution of organic semiconductor material using a mixture of the solution residing in an immiscible host liquid; and
   precipitating the organic semiconductor material from the solution to bridge gaps between the electrodes in the electrode pairs.

5. The method of claim 4, further comprising modifying a surface of the substrate to promote selective wetting of the electrode pairs by the solution.

6. The method of claim 4, further comprising immersing the substrate in the mixture.

7. The method of claim 6, further comprising stirring the mixture while the substrate is immersed.

8. The method of claim 7, wherein stirring the mixture creates a vortex in the mixture.

9. The method of claim 6, further comprising heating the mixture while the substrate is immersed.

10. The method of claim 4, wherein precipitation of the organic semiconductor material is performed under conditions that promote single crystal growth.

11. The method of claim 4, further comprising connecting source and drain leads to respective electrodes in the pairs of electrodes.

12. The method of claim 4, wherein the organic semiconductor material is an oligothiophene.

13. The method of claim 4, wherein the solution is a saturated or nearly saturated solution.

14. The method of claim 4, wherein the host liquid has a high boiling point of at least 180° C.

15. The method of claim 4, wherein the host liquid is a halogenated solvent.

16. The method of claim 4, wherein the substrate comprises silicon.

17. The method of claim 4, wherein the substrate is flexible.

18. The method of claim 4, further comprising modifying the electrode pairs to increase lyophilicity.

19. The method of claim 4, wherein the gaps between electrode pairs are about 10 microns or less.

20. The method of claim 4, wherein the mixture has a liquid host to solution volume ratio of 500:1 or greater.

21. A method of patterning a material on selected areas on a substrate surface, the method comprising:
   forming a solution of the material in a solvent;
   forming an immiscible mixture of the solution in a host liquid; and
   exposing the substrate surface to the mixture so that the solution selectively wets the selected areas.

22. The method of claim 21, wherein the solvent is more dense than the host liquid.

23. The method of claim 21, wherein the selected areas of the substrate comprise lyophilic regions surrounded by a lyophobic background.

24. A semiconductor device made using the method as recited in claim 1.

25. A semiconductor transistor device having attributes ensuing from a method as recited in claim 24.

26. A semiconductor device made using the method as recited in claim 21.

27. The method of claim 1, wherein selectively wetting the electrode pairs with a solution of organic semiconductor material includes introducing an organic semiconductor material to a surface of the substrate having lyophobic regions that are adjacent other regions including the electrode pairs, and using the lyophobic regions to mitigate the wetting of the substrate at the lyophobic regions, while wetting regions of the surface that include the electrode pairs.

28. A method for manufacturing organic semiconductor devices on a substrate having an array of electrode pairs, the method comprising:
   selectively wetting the electrode pairs with a solution of organic semiconductor material while a mechanical disturbance is applied to the solution, wherein selectively wetting the electrode pairs with a solution of organic semiconductor material includes introducing an organic semiconductor material to a surface of the substrate having lyophobic regions that are adjacent other regions including the electrode pairs, and using the lyophobic regions to mitigate the wetting of the substrate at the lyophobic regions, while wetting regions of the surface that include the electrode pairs; and
   precipitating the organic semiconductor material from the solution to bridge gaps between the electrodes in the electrode pairs; and applying the mechanical disturbance by applying a disturbance to generate shearing forces that are sufficient to mitigate wetting of the lyophobic regions and that are insufficient to mitigate wetting of the electrode pairs.

29. A method for manufacturing organic semiconductor devices on a substrate having an array of electrode pairs, the method comprising:
   selectively wetting the electrode pairs with a solution of organic semiconductor material while a mechanical disturbance is applied to the solution, wherein selectively wetting the electrode pairs with a solution of organic semiconductor material includes introducing an organic semiconductor material to a surface of the substrate having lyophobic regions that are adjacent other regions including the electrode pairs, and using the lyophobic regions to mitigate the wetting of the substrate at the lyophobic regions, while wetting regions of the surface that include the electrode pairs; and precipitating the organic semiconductor material from the solution to bridge gaps between the electrodes in the electrode pairs; and applying a disturbance to generate shearing forces that are sufficient to mitigate wetting of the lyophobic regions and sufficient to mitigate the formation of droplets covering at least two electrode pairs, and that are insufficient to mitigate wetting of individual electrode pairs.

30. The method of claim 4, wherein selectively wetting the electrode pairs with a solution of organic semiconductor material includes introducing the organic semiconductor material to a surface of the substrate having lyophobic regions that are adjacent other regions including the electrode pairs, and using the lyophobic regions to mitigate the wetting of the substrate at the lyophobic regions, and forming droplets of the solution at regions of the surface that include the electrode pairs.

31. The method of claim 21, wherein exposing the substrate surface to the mixture so that the solution selectively wets the selected areas includes selectively wetting the selected areas while using lyophobic characteristics of other areas of the substrate surface to mitigate wetting of the other areas.

32. The method of claim 1, wherein selectively wetting the electrode pairs includes selectively wetting electrode pairs on a planar surface of the substrate, each respective pair of electrodes being laterally adjacent another pair of electrodes and laterally separated from the other pair of electrodes by an exposed planar region of the substrate surface, by using hydrophobic characteristics of the planer region to form droplets of the solution bridging the gap between the electrodes in each pair and to mitigate the formation of droplets in the exposed planar region between the electrode pairs.

33. The method of claim 4, wherein selectively wetting the electrode pairs includes selectively wetting electrode pairs on a planar surface of the substrate, each respective pair of electrodes being laterally adjacent another pair of electrodes and laterally separated from the other pair of electrodes by an exposed planar region of the substrate surface, by using hydrophobic characteristics of the planer region to form droplets of the solution bridging the gap between the electrodes in each pair and to mitigate the formation of droplets in the exposed planar region between the electrode pairs.

34. The method of claim 21, wherein exposing the substrate surface to the mixture so that the solution selectively wets the selected areas includes selectively wetting selected areas on the surface of the substrate, each selected area being laterally separated from another one of the selected areas by an exposed planar region of the substrate surface, by using hydrophobic characteristics of the planer regions between each selected area to form droplets of the solution in the selected areas and to mitigate the formation of droplets in the exposed planar region between the selected areas.

\* \* \* \* \*